United States Patent
Yang et al.

(10) Patent No.: US 6,836,192 B1
(45) Date of Patent: Dec. 28, 2004

(54) METHODS AND APPARATUSES FOR TUNING VOLTAGE CONTROLLED OSCILLATORS

(75) Inventors: Shih-Tsung Yang, San Diego, CA (US); Jonathon Y. Cheah, San Diego, CA (US); Ee Hong Kwek, San Diego, CA (US); Chun-Yip Antony Lau, San Diego, CA (US)

(73) Assignee: Microtune (San Diego), Inc., San Diego, CA (US)

( * ) Notice: Subject to any disclaimer, the term of this patent is extended or adjusted under 35 U.S.C. 154(b) by 51 days.

(21) Appl. No.: 10/052,104

(22) Filed: Jan. 16, 2002

(51) Int. Cl.⁷ .................................. H03B 1/00
(52) U.S. Cl. .................. 331/179; 331/74; 331/36 C; 331/16; 331/117 R; 331/177 V; 331/185
(58) Field of Search ............... 331/74, 36 C, 331/16, 117 R, 117 V, 179, 185; 359/337

(56) References Cited

U.S. PATENT DOCUMENTS

| | | | |
|---|---|---|---|
| 5,182,528 A | 1/1993 | Zuta | 331/1 A |
| 5,625,325 A | 4/1997 | Rotzoll et al. | 331/16 |
| 6,366,393 B1 * | 4/2002 | Feulner et al. | 359/337 |
| 6,512,419 B1 * | 1/2003 | Adams et al. | 331/179 |

FOREIGN PATENT DOCUMENTS

| | | | |
|---|---|---|---|
| EP | 493251 A2 * | 1/1992 | |
| GB | 2 337 884 A | 12/1999 | H03C/3/09 |

OTHER PUBLICATIONS

Lin "A 900MHz, 2.5m A CMOS Frequency Synthesizer with an Automatic SC Tuning Loop" Electrical Engineering Dept. University of California, Los Angeles Mg 21–24 2000, pp 375–378.*
PCT Search Report for PCT/US 03/01301, 6 pages, Aug. 21, 2003.

* cited by examiner

Primary Examiner—Michael B Shingleton
(74) Attorney, Agent, or Firm—Baker Botts L.L.P.

(57) ABSTRACT

A method and apparatus for tuning a VCO circuit to provide desired modulations is described. In one embodiment, the method of the present invention uses a controlled voltage from a digital-to-analog converter to obtain VCO voltage/frequency characteristics. The VCO voltage/frequency characteristics are used to determine a VCO capacitance value as well as a charge pump current level for each frequency band of interest. For one embodiment, the VCO circuit includes a bank of switchable capacitors used to set the VCO capacitance value. The charge pump includes a number of switch-controlled current meters to set the charge pump current level. The VCO capacitors and charge pump current meters are controlled by an off-chip CPU.

35 Claims, 5 Drawing Sheets

Process Flow Diagram: 300

405

410

415

420

METHODS AND APPARATUSES FOR TUNING VOLTAGE CONTROLLED OSCILLATORS

FIELD OF THE INVENTION

The present invention relates generally to digital wireless communication, and more specifically to frequency modulation using a voltage-controlled oscillator (VCO).

BACKGROUND OF THE INVENTION

The proliferation of digital wireless communication systems has led to a need for reliable modulation circuitry. Phase-locked loop (PLL) circuits are attractive in modulation applications due to their combination of controllable modulation and stable so and adjustable carrier frequency.

As known in the art, a VCO can be used to effect Gaussian-shaped Continuous Phase Binary Frequency Shift Keying Modulation (GCPBFSK) in which the modulating wave shifts the output frequencies, away from the center frequency, by an amount between predetermined values. The predetermined values, i.e., two different frequencies representing zero and one, are called modulation deviation and are denoted by $f_0$ and $f_1$ respectively. The frequencies, $f_0$ and $f_1$ are typically equal. For example, for a wireless standard having 79 channels in a frequency range of 2402 MHz–2480 MHz with each channel separated by 1 MHz, the center frequencies may be equal to 2402 MHz+nMHz (n=0 to 78). The $f_0$ may range within some negative values (e.g., from −140 KHz to −175 Khz) and $f_1$ may range within a corresponding positive values (e.g. from 140 KHz to 175 KHz), in respect to the center frequency.

In order to keep frequencies $f_0$ and $f_1$ within their specific range, the voltage to the VCO must be controlled very carefully. Typical VCO gain (KVCO) may be on the order of 110 MHz/V–200 MHz/V. Typical VCOs may be operated from 0.6 v to 2.2 v, but actually only the linear range (1.0 v–1.8 v) can be used for this application, otherwise non-linear distortion will result.

For a wide frequency range (2402 MHz–2480 MHz), it is difficult to maintain a linear frequency response. The oscillation frequency of a VCO circuit is inversely proportional to the square root of the product of the inductance and capacitance (LC). It is possible to divide a large frequency range into segments to obtain a piecewise linear response over each segment. This can be achieved by using a set of switch-able capacitors, varactors (whose capacitance is voltage-controllable) and inductors. Often a larger frequency range is divided to account for the tolerance values of integrated capacitors and inductors that may run as high as 30%. Each segment is then covered by a specific capacitor's combination.

The voltage-frequency characteristics of a VCO vary from chip to chip. Therefore to obtain the appropriate modulation characteristics, the voltage to the VCO must be controlled depending on the characteristics of the chip. A typical PLL circuit in accordance with the prior art includes a charge pump, which acts as a current source. The charge pump consists of a set of current sources. The appropriate current source is chosen, based on the VCO voltage-frequency characteristics, to charge the capacitors of the LPF and thus controls the voltage to the VCO.

The difficulty arises in determining the VCO capacitance value (i.e. the capacitors' combination) and charge pump current value to provide the desired modulation deviation for each channel.

SUMMARY OF THE INVENTION

A method for setting the VCO circuit capacitance value and charge pump current level is described. To set the capacitance value, the operation frequency range is divided into a plurality of frequency bands. Then the frequency of a voltage-controlled oscillator (VCO) for each combination of capacitance values and lowest/highest control voltage levels is measured. A capacitance value for each frequency band is then selected such that the frequency band is between the lowest frequency (corresponding to the lowest voltage level) and highest frequency (corresponding to the highest control voltage).

To set the charge pump current level, a representative frequency is determined for each frequency band. Then VCO gain at the representative frequency is estimated and the charge pump current level for each frequency band is selected based upon the estimated VCO gain.

Other features and advantages of the present invention will be apparent from the accompanying drawings, and from the detailed description, that follows below.

BRIEF DESCRIPTION OF THE DRAWINGS

The present invention is illustrated by way of example, and not limitation, by the figures of the accompanying drawings in which like references indicate similar elements and in which.

DETAILED DESCRIPTION

A method and apparatus for tuning a VCO is described. An embodiment of the invention provides a method that determines the VCO variable capacitance value and the charge pump current level to provide desired modulation characteristics within a specified band.

In the following detailed description of the present invention, numerous specific details are set forth in order to provide a thorough understanding of the present invention. However, it will be apparent to one skilled in the art that the present invention may be practiced without these specific details. In some instances, well-known structures and devices are shown in block diagram form, rather than in detail, in order to avoid obscuring the present invention.

Figure 1:
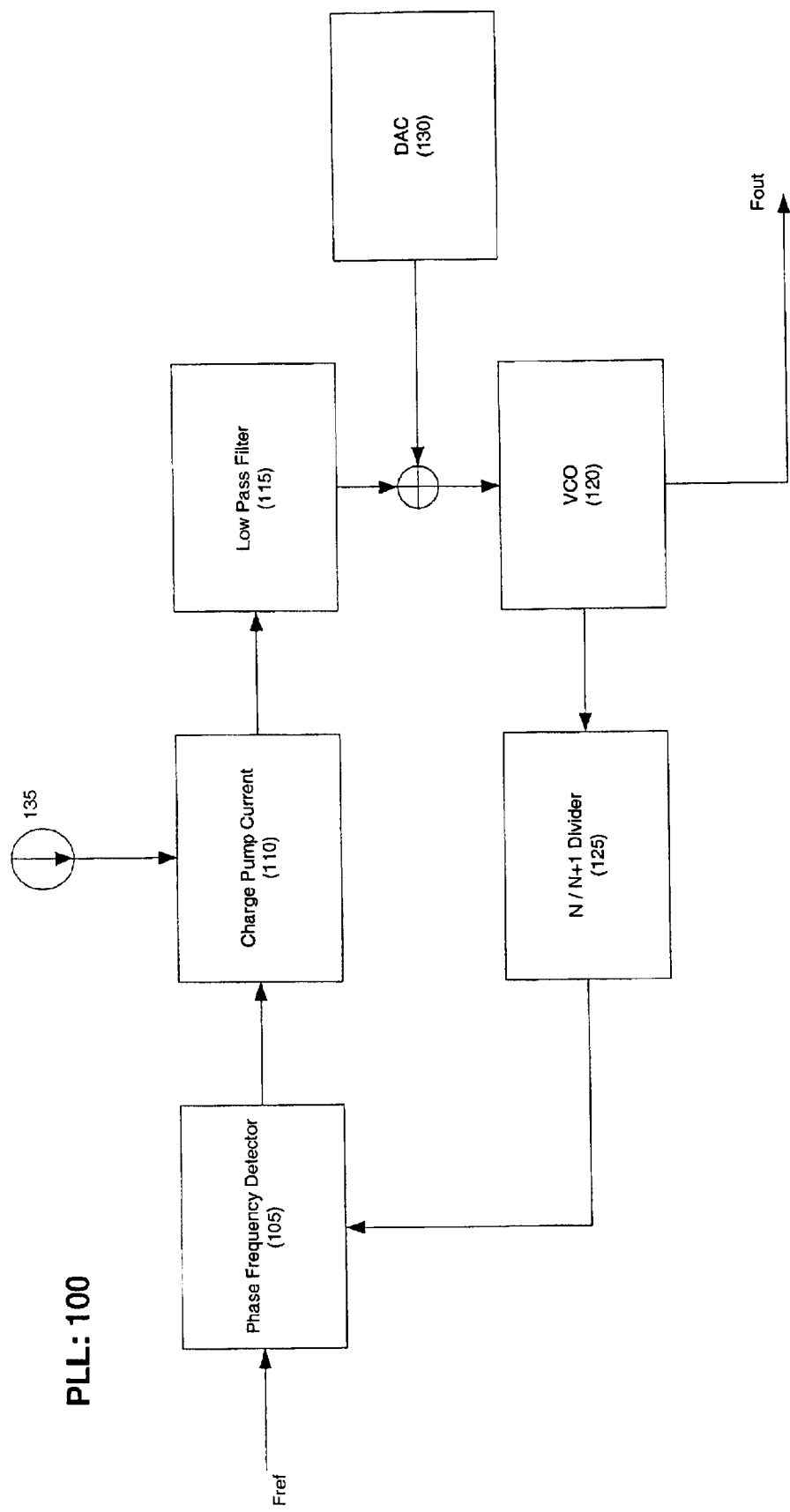
FIG. 1 illustrates a typical PLL circuit in accordance with the present invention.

FIG. 1 illustrates a typical PLL circuit in accordance with the present invention. The PLL circuit 100, shown in FIG. 1, includes a charge pump 110, fed by a current source 135. The current into the charge pump 110 determines how much current is pumped into the low pass filter (LPF) 115. This current charges the capacitors of the LPF 115 and thus controls the voltage to the VCO.

For one embodiment of the present invention the current source 135 has a number of switch-controlled current meters, not shown, that control the amount of current. Each switch may contribute current in varying amounts to provide 16 current levels. The current, which may be controlled from the CPU of a baseband chip, not shown, changes the increment/decrement of the voltage coming out of the LPF 115. The adjustable current allows varying the voltage at the voltage control layer to obtain the desired modulation For example, the frequency of a channel may be 2402 MHz+/− 160 Khz that corresponds to $V_0 +/- \Delta V$. The charge pump current controls the $\Delta V$. The current switches may be set to provide the desired output. To determine the current level required the VCO characteristics must first be determined.

Figure 2:
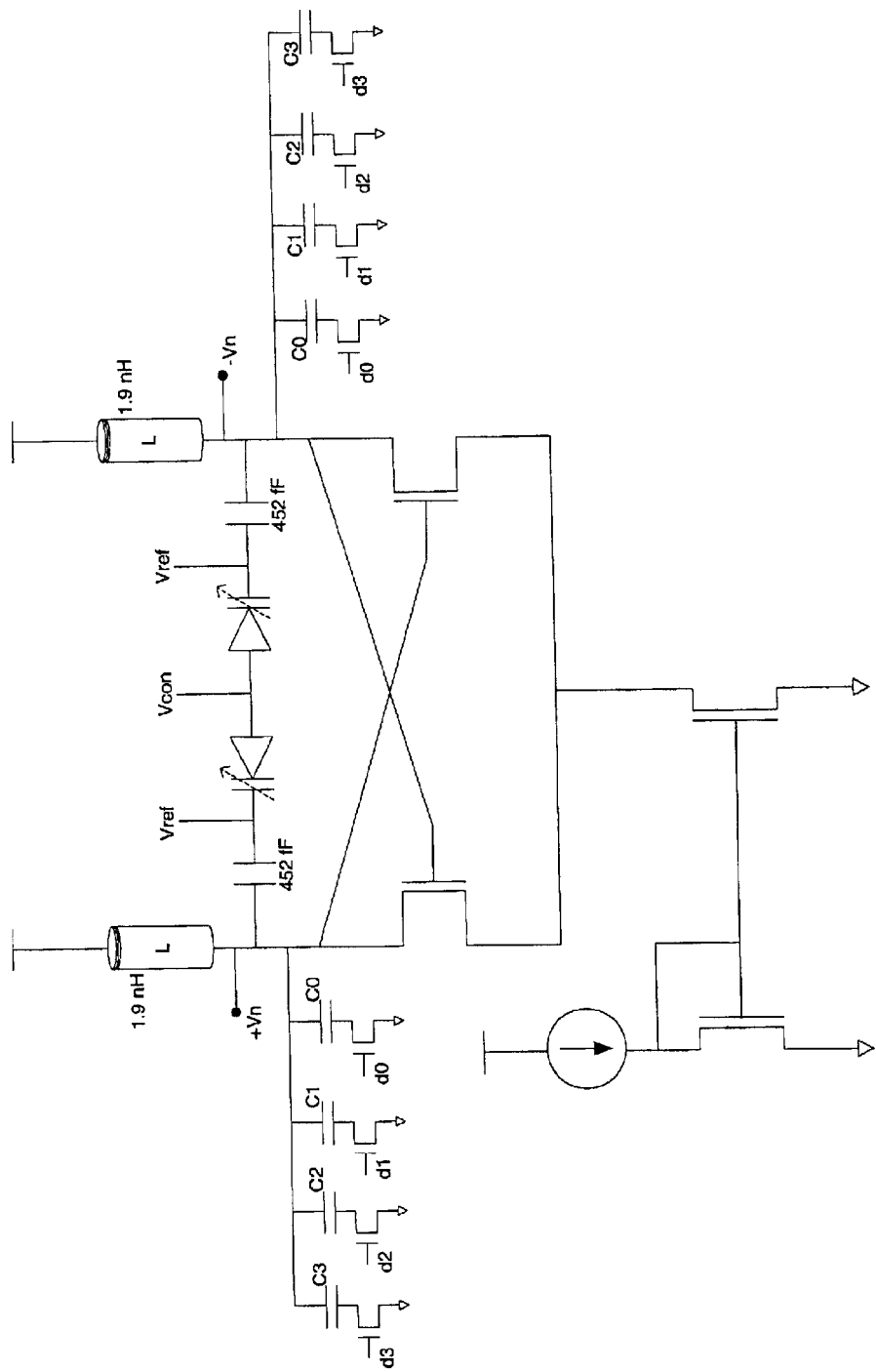
FIG. 2 illustrates a VCO circuit in accordance with the present invention.

FIG. 2 illustrates, in greater detail, the VCO 120 of FIG. 1. VCO 120 includes four capacitors $C_0$–$C_3$. Each capacitor has a switch $D_0$–$D_3$ that allows the capacitor to be turned on or off. The capacitors are directly controlled by the CPU of a baseband chip, not shown, that sets switches $D_0$–$D_3$. The four binary switches allow for 16 values of capacitance. The 16 values of capacitance may be chosen so that their values cover a range of frequencies much broader than the range of interest. For example, for the 16 capacitance values may cover a frequency range of 2200 MHz to 2600 MHz for a system utilizing a frequency range of 2402 MHz to 2480 MHz. This is done to account for the tolerance values of the passive components.

In order to accurately measure the VCO characteristics, the voltage source must be very well controlled. For one embodiment, voltage to the VCO 120 from the LPF 115 is cut and replaced with a control voltage from a digital-to-analog converter (DAC) 130. This is done to prevent any voltage variance from the LPF that may affect the measurement of VCO characteristics. The DAC provides voltage that is proportional to a digital input value. The DAC may thus provide voltages in uniform increments over a known linear range. For one embodiment the DAC may provide seven voltages, $V_1$–$V_7$, ranging from approximately 1.0 V to approximately 1.75 V in increments of approximately 0.125 V.

Figure 3:
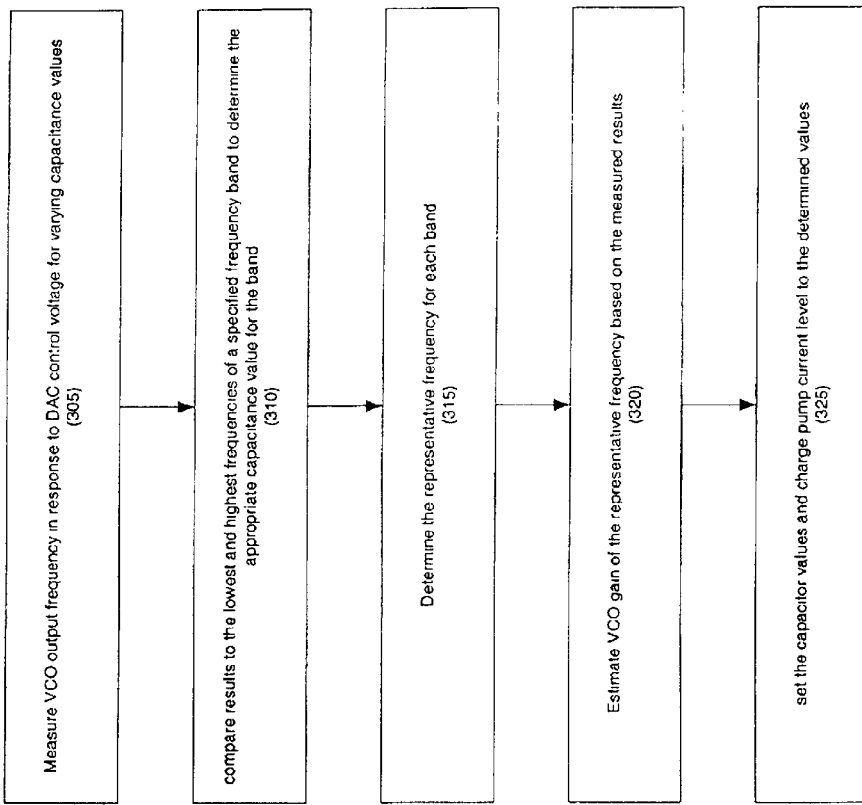
FIG. 3 is a process flow diagram in accordance with the present invention.
Figure 4:
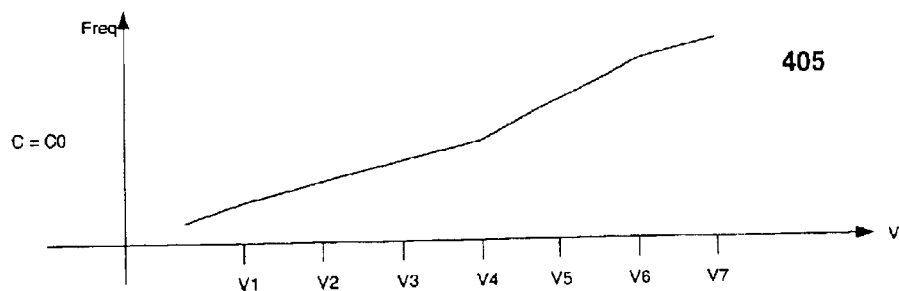
FIG. 4 illustrates, graphically, exemplary voltage frequency measurements in accordance with one embodiment of the present invention.
Figure 4:
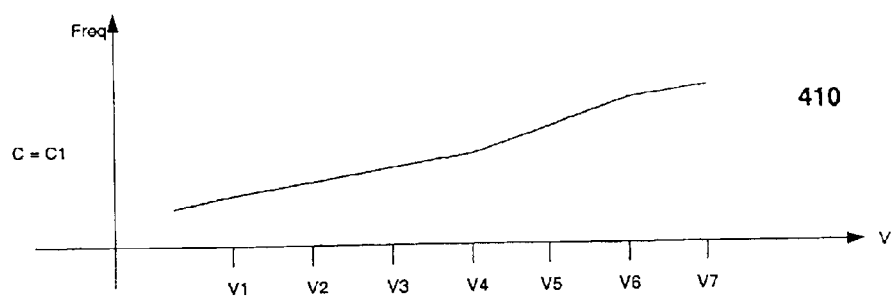
Figure 4:
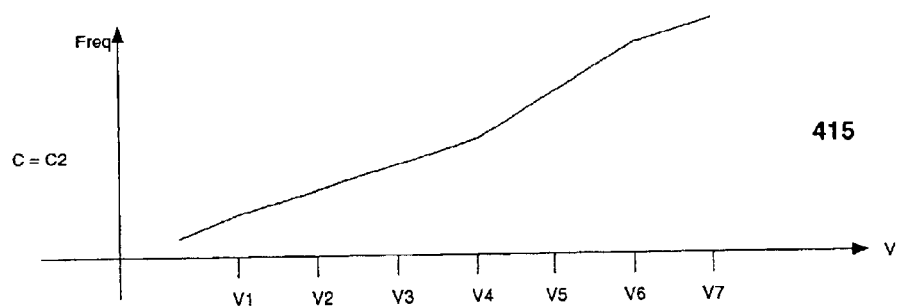
Figure 4:
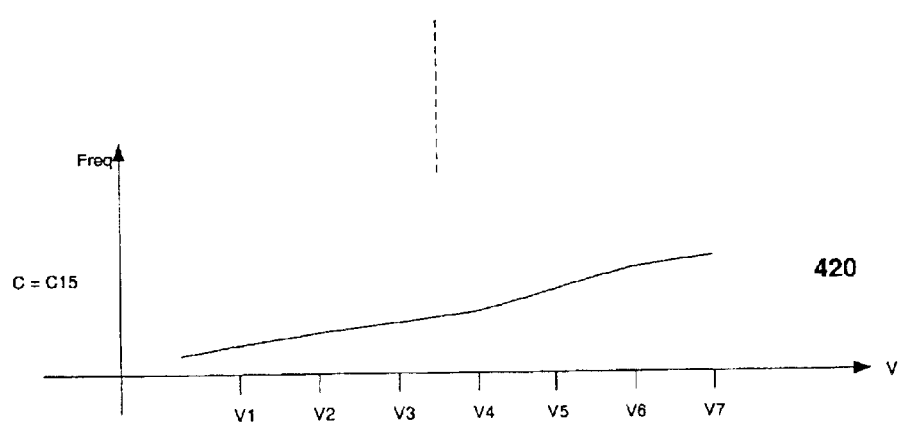

FIG. 3 is a process flow diagram in accordance with one embodiment of the present invention. The process 300, shown in FIG. 3, begins at operation 305 in which the voltage/frequency characteristics of the VCO are measured for a number of capacitance value/voltage level combinations. The frequency is measured for each of the 16 capacitance values at a number of controlled voltage levels (e.g., 7 levels) provided by the DAC. The measurement may be made at another chip where a CPU and a frequency counter reside. For example, the capacitance may be set to $C_0$ and then a counter located on the baseband chip measures the frequency for voltages $V_1$–$V_7$. FIG. 4 illustrates, graphically, exemplary voltage frequency measurements in accordance with one embodiment of the present invention. As shown in FIG. 4, graph 405 may indicate the measured frequencies for capacitance equal to $C_0$. Graph 410 and 415 may indicate the measured frequencies for capacitance equal to $C_1$ and $C_2$, respectively, continuing to $C_{15}$ illustrated by graph 420. Of course the graphs are not continuous, but constructed from the seven discrete frequency/voltage points. For each of the 16 levels of capacitance, the frequency/voltage characteristics of the VCO will be different.

At operation 310, the results of the frequency measurements are compared to desired frequency bands, or frequencies of interest. For an embodiment in which the range of capacitor values corresponds to a frequency range greater than the range of interest, an initial determination may be made to determine a capacitance value that covers the frequency range of interest. The covered frequency range for each capacitance value is measured with two specific DAC values (e.g., $V_1$ corresponds to the lowest frequency and $V_7$ corresponds to the highest frequency). This process may be illustrated with a simple example. The frequency range of interest is denoted by [$F_x$, $F_y$] where $F_x$/ $F_y$ is the lowest/highest frequency of the frequency band of interest. The capacitance value is chosen so that it covers the frequency range of interest, i.e. [$F_x$, $F_y$].

This process is repeated for other frequency bands of interest. For example, a system using frequencies 2402 MHz to 2480 MHz may be partitioned into six bands each covering approximately 13 MHz.

Once the appropriate capacitance value has been determined, the appropriate charge pump current may be determined by using the frequency/voltage characteristics of the VCO for the given capacitance. In a PLL circuit, the slope, S, of the VCO frequency/voltage characteristics multiplied by the current, I, should equal a constant (e.g., 14,000). Because S×I=14,000, the slope can be used to determine the appropriate current value. The targeted constant (e.g. 14000 as shown in the above) is normally determined by the digital controlled modulation waveform, which controls the divider ratio and is not shown in the FIG. 1.

At operation 315, a representative frequency is determined for each of the six bands. The representative frequency represents the band in terms of slope. Some wireless specifications allow for at most 10% variance in the slope, so the representative frequency must be determined accurately. For one embodiment this frequency may be obtained from the direct measurement of a number of VCO circuit chips. For one embodiment several hundred chips are tested to determine the representative frequency. The representative frequencies, determined through testing, are then applied to all chips.

At operation 320 the VCO gain (frequency-voltage slope) is estimated at the representative frequency. For one embodiment the slope is estimated through a $3^{rd}$ order polynomial interpolation of selected points around the representative frequency. In an alternative embodiment the slope may be estimated through a second order interpolation.

Once the slope has been estimated the appropriate charge pump current level is determined. In one embodiment a mapping table may be used to obtain the charge pump current level corresponding to the estimated slope.

Thus, the method of one embodiment of the present invention allows an appropriate VCO capacitance level and charge pump current level to be determined for each frequency band of interest. At operation 325, the VCO capacitance value and charge pump current level is set to determined values.

The operations of determining and setting the VCO capacitance value and charge pump current level in accordance with the present invention may be implemented by hardware and/or software contained within a baseband chip. For example, the baseband chip may include a central processing unit (CPU) that can execute code or instructions stored within a machine-readable medium that may also be included within the baseband.

The machine-readable medium may include a mechanism that provides (i.e., stores and/or transmits) information in a form readable by a machine such as computer or digital processing device. For example, a machine-readable medium may include a read only memory (ROM), random access memory (RAM), magnetic disk storage media, optical storage media, flash memory devices. The code or instructions may be represented by carrier-wave signals, infrared signals, digital signals, and by other like signals.

Figure 5:
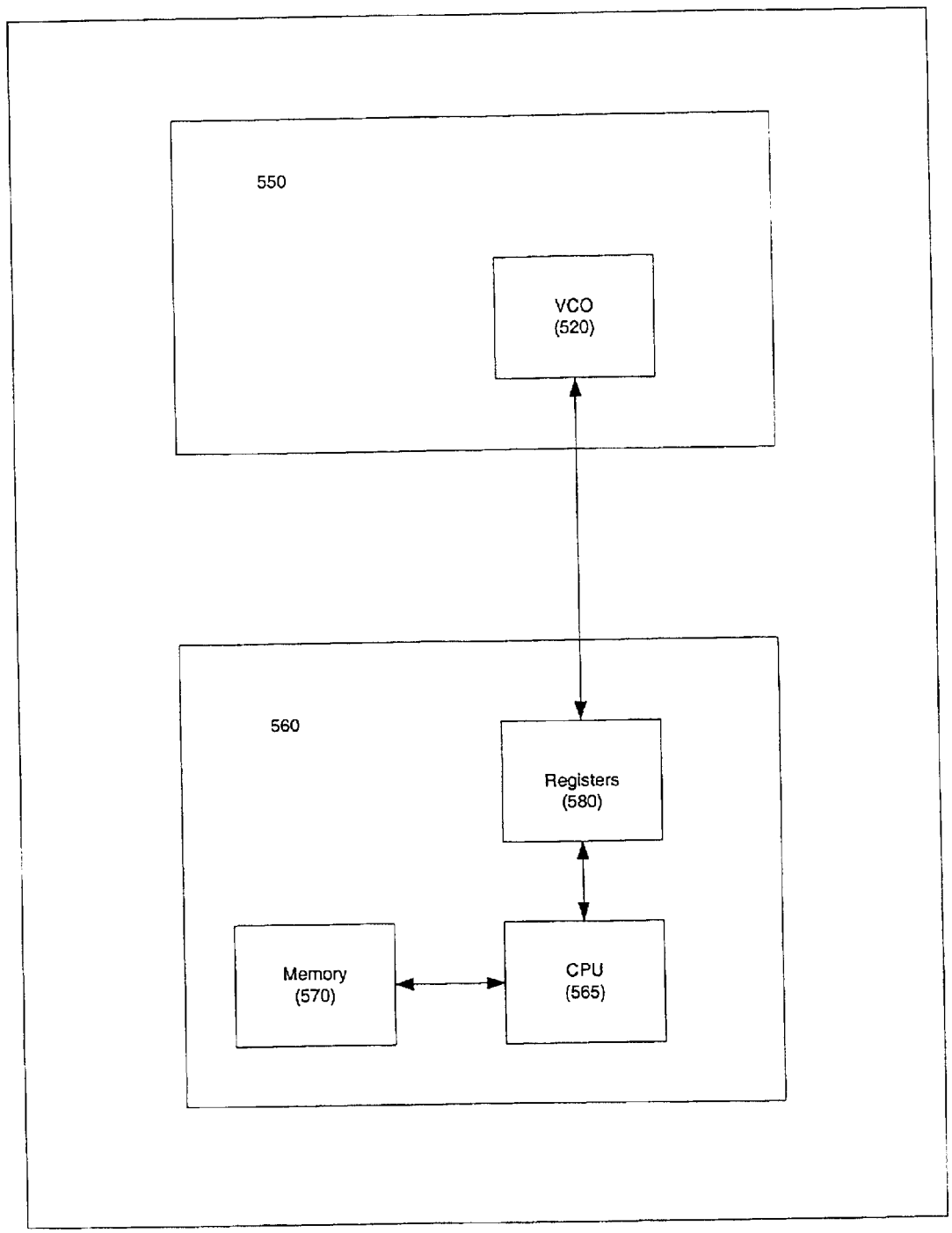
FIG. 5 illustrates a system block diagram in accordance with one embodiment of the present invention.

FIG. 5 illustrates a system block diagram in accordance with one embodiment of the present invention. The system 500, shown in FIG. 5, includes RF chip 550. RF chip 550 contains the PLL circuit having VCO circuit 520. RF chip 550 is 560. Baseband chip 560 includes a CPU 565 coupled to a memory device 570. Memory device 570 stores the code for the algorithm of the present invention. The CPU 565 executes the code and set registers 580 that in turn control the charge pump current level and VCO capacitance value.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
   a) dividing a frequency range into a plurality of frequency bands of interest;
   b) measuring a frequency of a voltage-controlled oscillator (VCO) for a plurality of capacitance value/voltage level combinations to obtain a set of capacitance values and a corresponding set of frequency values for a set of voltage levels;
   c) selecting a capacitance value such that a corresponding frequency range covers the frequency band of interest, the corresponding frequency range determined by an output voltage of a digital-to-analog converter;
   d) repeating operation c) for each frequency band of interest;
   e) determining a representative frequency for a frequency band;
   f) estimating a VCO gain at the representative frequency;
   g) selecting a charge pump current level for the frequency band, the charge pump current level based upon the VCO gain; and
   h) repeating operations e) through g) for each frequency band of interest.

2. The method of claim 1, wherein the frequency range of the VCO is 2200 MHz–2600 MHz.

3. The method of claim 1, wherein the plurality of frequency bands of interest comprises 6 frequency bands.

4. The method of claim 1, wherein the frequency range of interest is 2402 MHz–2480 MHz.

5. The method of claim 2, wherein the frequency bands of the VCO comprises 16 frequency bands.

6. The method of claim 1, wherein the VCO has a capacitance value set by a bank of switchable capacitors.

7. The method of claim 6, wherein the bank of switchable capacitors comprises four binary switch capacitors such that the capacitance value may be set to one of 16 capacitance values.

8. The method of claim 7, wherein the VCO has a voltage set by a controlled voltage source.

9. The method of claim 8, wherein the controlled voltage source is a digital-to-analog converter (DAC).

10. The method of claim 9, wherein the DAC has 7 output voltage levels, the output voltage levels ranging from approximately 1.0 volts to approximately 1.75 volts in 0.125 volt increments.

11. The method of claim 10, wherein the plurality of capacitance value/voltage level combinations comprises each of the 16 capacitance values combined with each of the 7 voltage levels.

12. The method of claim 1, wherein the representative frequency is determined through empirical data.

13. The method of claim 1, wherein the charge pump current level is selected from a plurality of charge pump current levels.

14. The method of claim 13, wherein the plurality of charge pump current levels are provided through a set of switchable current meters.

15. A machine-readable medium containing instructions which, when executed by a processor, cause the processor to perform a method, the method comprising:
   a) dividing a frequency range into a plurality of frequency bands of interest;
   b) measuring a frequency of a voltage-controlled oscillator (VCO) for a plurality of capacitance value/voltage level combinations to obtain a set of capacitance values and a corresponding set of frequency values for a set of voltage levels;
   c) selecting a capacitance value such that a corresponding frequency range covers the frequency band of interest, the corresponding frequency range determined by an output voltage of digital-to-analog converter;
   d) repeating operation c) for each frequency band;
   e) determining a representative frequency for a frequency band of interest;
   f) estimating a VCO gain at the representative frequency;
   g) selecting a charge pump current level for the frequency band, the charge pump current level based upon the VCO gain; and
   h) repeating operations e) through g) for each frequency band.

16. The machine-readable medium of claim 15, wherein the frequency range of a VCO is 2200 MHz–2600 MHz.

17. The machine-readable medium of claim 15, wherein the plurality of frequency bands of interest comprises 6 frequency bands.

18. The machine-readable medium of claim 15, wherein the frequency range of interest is 2402 MHz–2480 MHz.

19. The machine-readable medium of claim 16, wherein the frequency range of VCO comprises 16 frequency bands.

20. The machine-readable medium of claim 15, wherein the VCO has a capacitance value set by a bank of switchable capacitors.

21. The machine-readable medium of claim 20, wherein the bank of switchable capacitors comprises four binary switch capacitors such that the capacitance value may be set to one of 16 capacitance values.

22. The machine-readable medium of claim 21, wherein the VCO has a voltage set by a controlled voltage source.

23. The machine-readable medium of claim 22, wherein the controlled voltage source is a digital-to-analog converter (DAC).

24. The machine-readable medium of claim 23, wherein the DAC has 7 output voltage levels, the output voltage levels ranging from approximately 1.0 volts to approximately 1.75 volts in 0.125 volt increments.

25. The machine-readable medium of claim 24, wherein the plurality of capacitance value/voltage level combinations comprises each of the 16 capacitance values combined with each of the 7 voltage levels.

26. The machine-readable medium of claim 25, wherein the representative frequency is determined through empirical data.

27. The machine-readable medium of claim 26, wherein the charge pump current level is selected from a plurality of charge pump current levels.

28. The machine-readable medium of claim 27, wherein the plurality of charge pump current levels are provided through a set of switchable current meters.

29. A system comprising:
a phase-locked loop (PLL) circuit, the PLL circuit including a) a VCO circuit, the VCO circuit having a plurality of switchable capacitors to set the VCO circuit capacitance value, the VCO circuit having a controlled voltage source, b) a charge pump, having a plurality of switchable current meters to set the charge pump current level;
a central processing unit;
a memory device coupled to the central processing unit, the memory having stored therein instructions which, when executed by the central processing unit, cause the central processing unit to
a) divide a frequency range into a plurality of frequency bands of interest;
b) measure a frequency of the voltage-controlled oscillator (VCO) for a plurality of capacitance value/voltage level combinations to obtain a set of capacitance values and a corresponding set of frequency values for a set of voltage levels;
c) select a capacitance value such that a corresponding frequency range covers the frequency band of interest, the corresponding frequency range determined by an output voltage of a digital-to-analog converter; and
d) repeat operation c) for each frequency band,
e) determine a representative frequency for a frequency band;
f) estimate a VCO gain at the representative frequency;
g) select a charge pump current level for the frequency band, the charge pump current level based upon the VCO gain; and
h) repeating operations e) through g) for each frequency band.

30. The system of claim 29, wherein the frequency range is 2402 MHz–2480 MHz.

31. The system of claim 29, wherein the plurality of frequency bands of interest comprises 6 frequency bands.

32. The system of claim 29, wherein the bank of switchable capacitors comprises four binary switch capacitors such that the capacitance value may be set to one of 16 capacitance values.

33. The system of claim 29, wherein the controlled voltage source is a dialog-to-analog converter (DAC), the DAC having 7 output voltage levels, the output voltage levels ranging from approximately 1.0 volts to approximately 1.75 volts in 0.125 volt increments.

34. The system of claim 33, wherein the plurality of capacitance value/voltage levels combinations comprises each of the 16 capacitance values combined with each of the 7 voltage levels.

35. The system of claim 29, wherein the representative frequency is determined through empirical data.

* * * * *